United States Patent
Bahl et al.

(10) Patent No.: US 7,372,755 B2
(45) Date of Patent: May 13, 2008

(54) ON-CHIP STORAGE MEMORY FOR STORING VARIABLE DATA BITS

(75) Inventors: Swapnil Bahl, New Delhi (IN); Balwant Singh, Uttar Pradesh (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 119 days.

(21) Appl. No.: 11/102,463

(22) Filed: Apr. 8, 2005

(65) Prior Publication Data

US 2005/0232028 A1    Oct. 20, 2005

(30) Foreign Application Priority Data

Apr. 8, 2004    (IN) .................................. 694/04

(51) Int. Cl.
*G11C 7/00* (2006.01)
(52) U.S. Cl. ............. 365/221; 365/230.05; 365/189.04
(58) Field of Classification Search ................ 365/221, 365/230.05, 189.04
See application file for complete search history.

(56) References Cited

U.S. PATENT DOCUMENTS

| | | | |
|---|---|---|---|
| 5,420,984 A * | 5/1995 | Good et al. ................... 710/22 |
| 5,487,049 A * | 1/1996 | Hang ........................ 365/221 |
| 5,703,812 A | 12/1997 | Ryu |
| 5,708,618 A | 1/1998 | Toda et al. |
| 5,761,478 A | 6/1998 | Chen et al. |
| 5,787,454 A * | 7/1998 | Rohlman ........................ 711/5 |
| 5,825,692 A * | 10/1998 | Baumgartner et al. . 365/189.04 |
| 6,026,032 A | 2/2000 | Nordman et al. |
| 6,424,591 B1 * | 7/2002 | Yu et al. ................ 365/230.09 |
| 6,467,021 B1 | 10/2002 | Sinclair |
| 2001/0055232 A1 | 12/2001 | Yoshioka |

OTHER PUBLICATIONS

Gharsalli, Ferid et al., Automatic Generation of Embedded Memory Wrapper for Multiprocessor SoC, Jun. 10, 2002, pp. 1-6.
ProASIC PLUS RAM/FIFO Blocks, Actel Application Note, Aug. 2006, URL=http://www.actel.com/documents/APA_RAM_FIFO_AN.pdf.

* cited by examiner

*Primary Examiner*—Tuan T. Nguyen
(74) *Attorney, Agent, or Firm*—Lisa K. Jorgenson; E. Russell Tarleton; Seed IP Law Group PLLC

(57) ABSTRACT

An improved on-chip storage memory and method for storing variable data bits, the memory including an on-chip storage memory system for storing variable data bits that has a memory for storing data bits, a wrapper for converting the memory into a first-in first-out (FIFO) memory, and a controller for performing operations on the memory. In operation, the memory is converted into a FIFO memory after storing data, and output logic selects data to be output in a serial manner.

25 Claims, 5 Drawing Sheets

ON-CHIP STORAGE MEMORY FOR STORING VARIABLE DATA BITS

BACKGROUND OF THE INVENTION

1. Field of the Invention

This invention relates to an improved on-chip storage memory for storing variable data bits.

2. Description of the Related Art

Many memory instances are used in system on chips for storing data of variable lengths. FIFO (first in first out) or SRAM (static read/write memory) are primarily used for storing the data bits and also for high speed data buffering. Since the width of the memory is fixed and data to be stored is of variable length, memory is not efficiently utilized.

In conventional system on chips, there are number of memories utilized in the chip for data storage. The data bits may be processed by a particular block and used by either another block or their results are stored inside the chip after performing different operations. The data bits can be of different lengths. If some compression technique is used, the variation in number of bits to be stored is large.

FIGS. 1(a) and 1(b) depict two conventional methods of memory storage. FIG. 1(a) shows a method in which different memory instances (11) of different possible widths are used. Addressing is done by Virtual Address Decoding (10).

FIG. 1(b) depicts an SRAM/FIFO (12) with width equal to maximum data bits to be transferred. The data with less width is stored after 0 stuffing.

In U.S. Pat. No. 6,026,032 a dual-port, static random access memory (DPSRAM) is described as a virtual first-in-first-out (FIFO) register under the control of a microprocessor executing a stored program or similar circuit to allow both conventional random access data buffering between the data source and the data receiver and FIFO-type data buffering in which the data source and data receiver need not generate an address for each data word transferred, but these addresses may be automatically generated in sequence by the buffer using special circuitry.

It provides a high-speed data buffer for connecting a data source to a data receiver, the data buffer having a first interface receiving data from the data source and a second interface outputting the data to the data receiver. A dual port random access memory has a first port, with first address and first data lines, communicating with the first interface, and a second port, with second address and second data lines, communicating with the second interface. First address counter circuitry communicates with the first address lines to accept a first starting address and increment the first starting address applied to the first address lines as data is received from the first interface. Second address counter circuitry communicates with the second address lines to accept a second starting address and increment the second starting address applied to the second address lines as data is transmitted to the second interface.

This approach thus uses a virtual first-in-first-out memory along with a controller utilizing a fixed algorithm.

Also, U.S. Pat. No. 6,467,021 presents a data system having a store, a memory, a user interface and a memory controller where the memory is used to buffer all data transferred between the user interface and the store, the memory controller copying data directly between the store and the memory, whereas the memory controller re-organizes data when the data is transferred between the memory and the user interface. The arrangement described above for management of the storage of data with variable block size relies on the principles of partitioning of a data block to locate it efficiently in a storage medium and relocation of a data block to compensate for any change in size of the stored data blocks. It demands multiple random accesses to the storage medium for data block read and write operations and hence can only provide a high performance data storage system if fast memory is used for the storage device.

Therefore, although block sizes are of fixed size in a data storage system before compression but after data compression the size may vary over a very wide range. An efficient storage management arrangement must be able to cope with the dynamic nature of the block size distribution.

U.S. Pat. No. 5,703,812 describes a multi-bit data output buffer for transferring multi-bit data from a semiconductor memory device to the peripheral circuit. It includes a data input circuit for inputting at least two bit data, at least two bit data buffering circuits, each of at least two bit data buffering circuits buffering a corresponding one of at least two bit data from the data input circuit, and a bit data comparison circuit for controlling the amount of current flowing to at least two bit data buffering circuits according to logic values of at least two bit data from the data input circuit. The multi-bit data output buffer is capable of minimizing the generation of noise in the output data and enhancing a response speed of the output data with respect to the input data.

U.S. Pat. No. 5,761,478 relates to an arrangement for interfacing a microprocessor with a memory external thereto wherein the data size and the width of the interface both may vary.

A memory interface unit for coupling a microprocessor to a memory external to the microprocessor is described, the memory being utilized for the storage of data therein and the retrieval of data therefrom, and the memory being provided in one or more memory banks, each of the banks being provided with a set of address lines and a byte enable line, data being transferring to and from each of the memory banks on a group of data lines. The memory banks are provided in one or more banks whereby the group or groups of data lines, as the case may be, provide a memory data path having a physical transfer width for transfer of data to and from the memory, and the data being stored and retrieved over the memory data path in two or more data types, each type having a different size. The memory interface unit is provided with a set of address pins and a set of strobe pins, and it includes a first element for providing an indication of a physical transfer width of a memory coupled to the memory interface unit.

Also included is a second element for providing an indication of a data type to be transferred to or from the memory. A third element, responsive to the first element and the second element, depending on the data type indication, provides to the address pins an address, shifted in position, with at least some of the address lines used for coupling to the address lines of the one or more banks of memory, as the case may be, and with one or more of the address pins used for activation of the byte enable line or lines, as the case may be, for data to be transferred, or, alternatively, providing to the address pins an address, unshifted in position, for coupling to the address lines of the one or more banks of memory, as the case may be, for addressing data to be transferred. Depending on the physical transfer width indication, the third element also causes one or more of the strobe pins to be used as additional address pins.

But in these methods a large portion of memory is not utilized. Since a large portion of the chip is taken by these memories, proper utilization is needed. Moreover the memory devices discussed above either use memory for dumping variable data bits or as a data buffer.

BRIEF SUMMARY OF THE INVENTION

The disclosed embodiments of the present invention provide a memory and a methodology, which gives a complete utilization of storage memories for storing variable width data bits. The memory is converted into an equivalent 1 bit wide memory with same capacity and data bits are stored and retrieved serially, bit by bit.

Another aspect of the present invention is to use a dual port memory of any size or variable size FIFO irrespective of possible data widths.

Yet another feature of the present invention is to provide storage memory in accordance to the area available on the chip.

Another aspect of the present invention is to provide a method that results in efficient usage of system when used along with some data compression technique, which compresses data to variable data bits.

A further aspect of the present invention is to provide data buffering between two devices operating at different data rates.

Yet another aspect is to facilitate data reading or writing any number of times from the memory.

In accordance with another embodiment of the invention, an on-chip storage memory system for storing variable data bits is provided that includes a memory for storing data bits; a wrapper for converting the memory into a first-in first-out (FIFO) memory; and a controller for performing operations on the memory.

An output logic is also provided for selecting bit/bits from the output of the FIFO memory for outputting the stored data bits in a serial manner, and the memory includes any size semi-custom or full custom SRAM.

The semi-custom or full custom SRAM is preferably a dual port or four-port memory; the dual port memory is used for normal operation and the four port memory is used when the memory acts as a data buffer.

The FIFO is ideally of variable size, and the wrapper is required when said memory used is not a FIFO. The wrapper includes counters and multiplexers for converting a dual port memory into a first-in first-out memory.

Preferably, the controller is a state machine, and the output logic is a multiplexer. The controller includes a read and write interface for storing and reading data from the memory.

An improved method for storing variable data bits on an improved on-chip storage memory is also provided that includes the steps of storing data bits in a memory; converting the memory into a first-in first-out (FIFO) memory using a wrapper; controlling read/write operations of the FIFO memory in response to store and retrieve signals generated by a controller; and, selecting one bit from the output of the memory using an output logic for outputting the stored data bits in a serial manner, thereby reading and writing the data bits in a serial manner.

The storing and retrieving data from a read write interface includes the steps of an internal write operation done by a write interface for first bits of data followed by simultaneous internal write and read operations for subsequent data bits; fill operation for simultaneous write and read operations to rearrange the data stored inside the memory; and internal read operation done by a read interface followed by simultaneous internal write and read operations for subsequent data bits.

The data can be any sized data.

In accordance with another embodiment of the invention, a circuit is provided that includes a memory circuit for storing data bits; a wrapper circuit coupled to the memory circuit and configured to convert the memory circuit into a first-in first-out (FIFO) memory; a controller for generating control signals to the memory circuit and the wrapper circuit; and an output circuit coupled to the controller and the memory circuit for outputting data bits from the memory circuit. Ideally, the memory circuit comprises one of a dual port synchronous memory and a four port synchronous memory of any bit size, the memory configured to have a first port used as a write port for writing data and a second port as a read port for reading data, the memory circuit configured as a semi-custom or full custom SRAM memory that is selected to be a dual port memory for use in normal operations and a four port memory for use when the memory circuit functions as a data buffer.

In accordance with yet another embodiment of the invention, a method for storing data is provided, the method including writing data bits into the memory in serial fashion; after all data is written to the memory, filling in unused bits of the memory with dummy bits and counting a total number of valid data storage bits written in the memory; and reading selected data bits from the memory in a serial fashion using an output logic circuit for outputting the data bits in a serial manner.

In accordance with a further embodiment of the invention, a system is provided that includes a memory for storing variable data bits having at least one write port for writing data into the memory and at least one read port for reading data from the memory; a circuit for converting the memory into a first-in first-out (FIFO) memory; and a circuit for controlling the memory and the converting circuit for performing modified read and write operations internally and an internal fill operation that is performed before reading.

BRIEF DESCRIPTION OF THE DRAWINGS

The invention will now be described with reference to and as illustrated in the accompanying drawings.

DETAILED DESCRIPTION OF THE INVENTION

The embodiments of the invention relate to on-chip storage memory devices used as a storage device for dumping variable data bits or as a data buffer for temporarily storing data transmitted between a source and a receiver. Data buffers are used for efficient communications between the source and the receiver. Data buffers eliminate inefficiencies and smoothen the data flow when the data source or data receiver is idle while waiting for the other to complete the operation. In this methodology, the data can be written and read from the memory any number of times. Memory used could be a dual port or four port depending upon the clock rates of the source and destination while it is used as a data buffer. When the memory is used for dumping variable data bits, a dual port memory is preferred, one port each for writing in and reading out from memory.

Figure 1A:
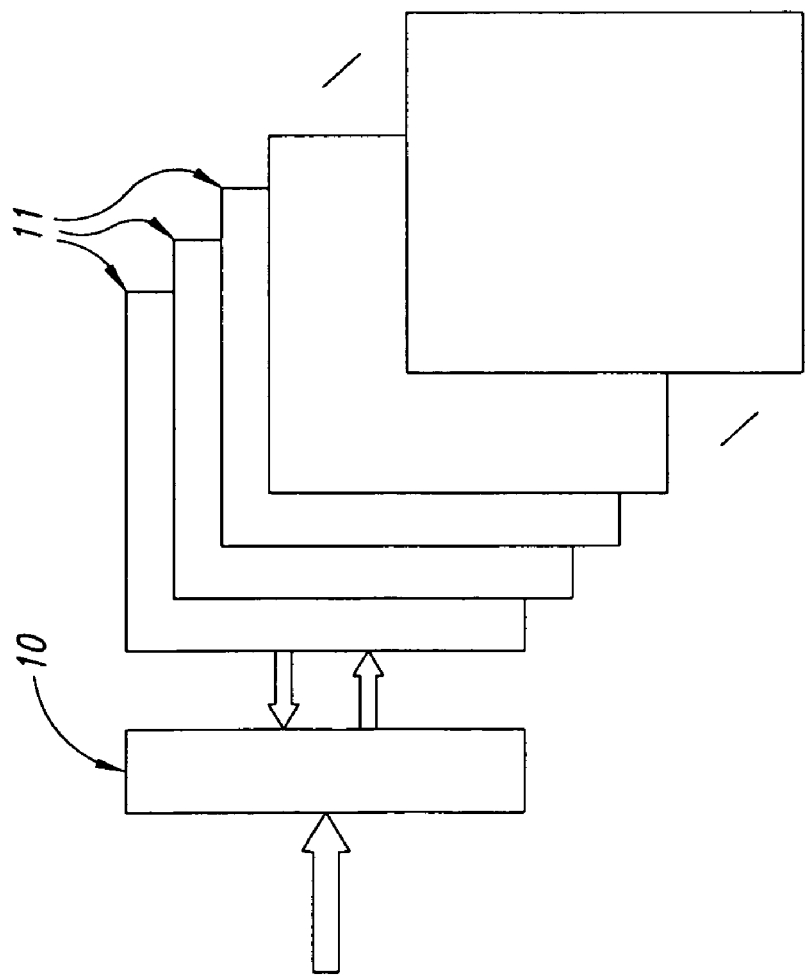
FIGS. 1A and 1B show known memories in the related field.
Figure 1B:
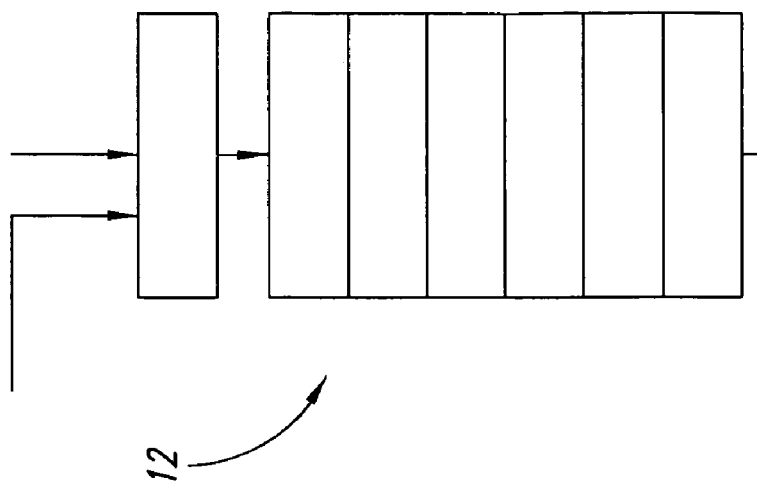
Figure 2:
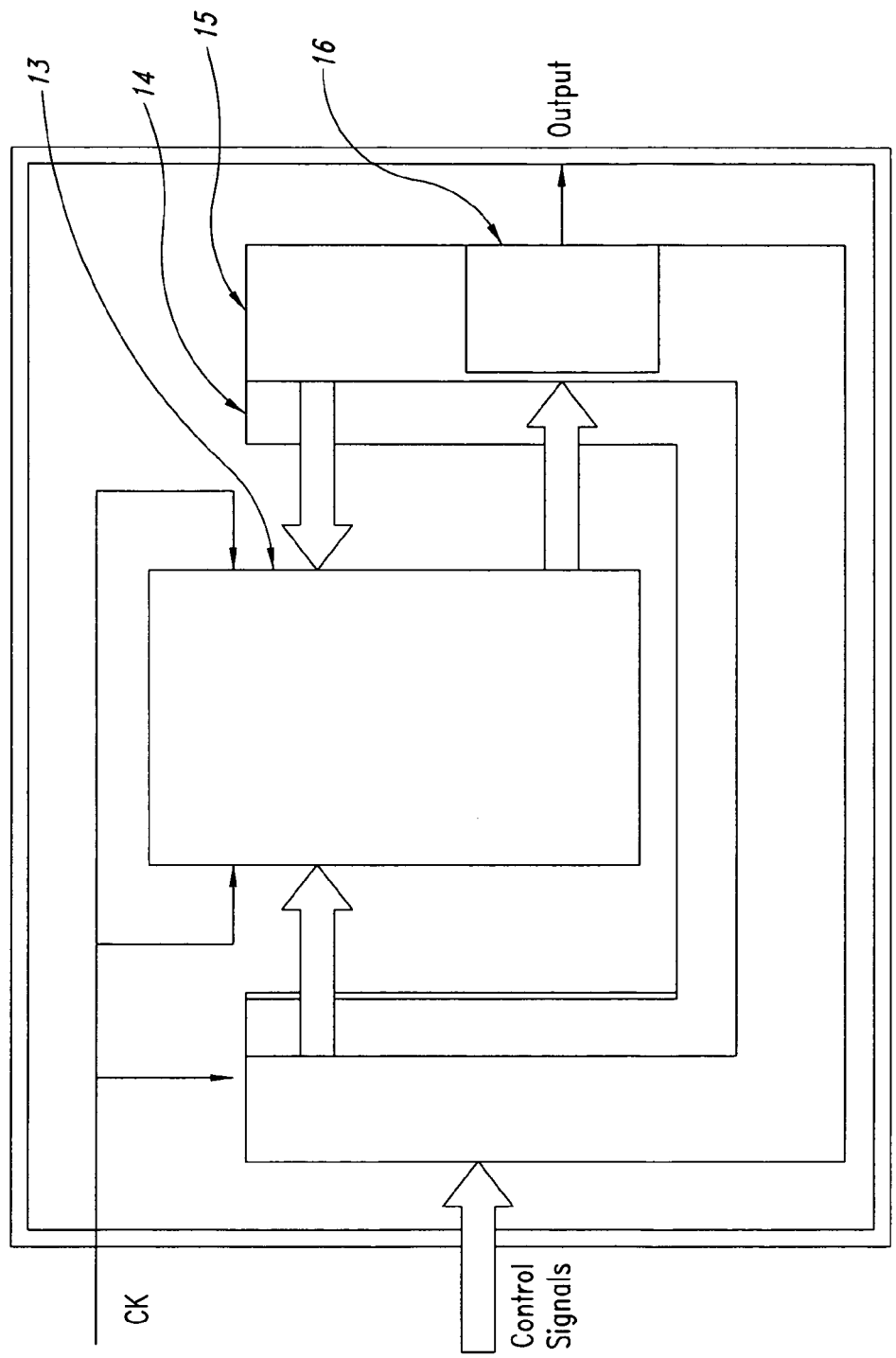
FIG. 2 shows a block diagram of a memory with a wrapper and a controller.

The architecture given in FIG. 2 is composed of 4 blocks namely, a FIFO memory (13), a memory wrapper (14), a controller (15) and output logic (16).

The FIFO memory (13) is a dual port synchronous memory, which has one write and one read port. One port is used as a write port for writing data in the memory and the other as a read port for reading data from the memory. The memory can be a semi-custom or full custom SRAM. It can be of any bit size. If a FIFO (first-in first-out) memory is available, then it can be used directly.

The memory wrapper (14) is a circuit that has counters and multiplexers required for converting a dual port memory into a first-in first-out memory. One port is converted into a write port and the other into a read port. If the memory used is a FIFO, then this part is not required. Further the construction of the wrapper varies with the circuit to which it is connected. The wrapper may be implemented in other hardware forms or as a software.

The controller (15) is a state machine, which generates control signals for the FIFO memory (13). However, it can be implemented using different hardware circuits and software. There are three possible operations, namely write, read, and fill. Write and read operations are modified internally and are transparent to the user. Fill is an internal operation, which is done before reading. It can also be combined with the read operation. The read and write clocks of the memory and the controller clock should be the same. The three operations are explained below:

Write: Write is done in a serial fashion bit by bit. The write operation is modified in the following manner.

(a) If the write operation is after a read operation, then write and read pointers are reset, otherwise no reset operation is done.

(b) After reset, an internal write operation for storage bits is initiated starting with column 1 of the FIFO memory.

(c) Once N−1 storage bits are written in column 1 of the memory, it is followed by simultaneous internal read and write operations for the next storage bits. If the read and write clocks have a skew between them, then it should be such that the write operation occurs before the read operation.

Fill: This is a special operation, that is needed to arrange the stored data inside the memory in a particular fashion. It can be a separate operation or can be combined with either a last write or before a first read operation. It basically fills in the unused bits of a particular column by a dummy bit. If the entire column is filled, then this operation is not used.

This operation consists of simultaneous internal read and write operations. The number of such operations is equal to (words—(NW mod words)), where NW is total number of valid data storage bits written in the memory. The controller using a counter calculates this number. After this operation, the last column contains valid data storage bits Read: The read operation is done after the fill operation. Read is also done in a serial fashion. Read operation is modified in the following manner.

(a) Read and write pointers are reset.

(b) For reading a first bit, one internal read operation is done.

(c) For subsequent reading, simultaneous internal read and write operations are done. If the read and write clocks have a skew between them, then it should be such that the write operation occurs before the read operation.

The output logic (16) is a multiplexer, which selects one bit from the output of the memory (13). The width of the output is one bit.

Figure 3:
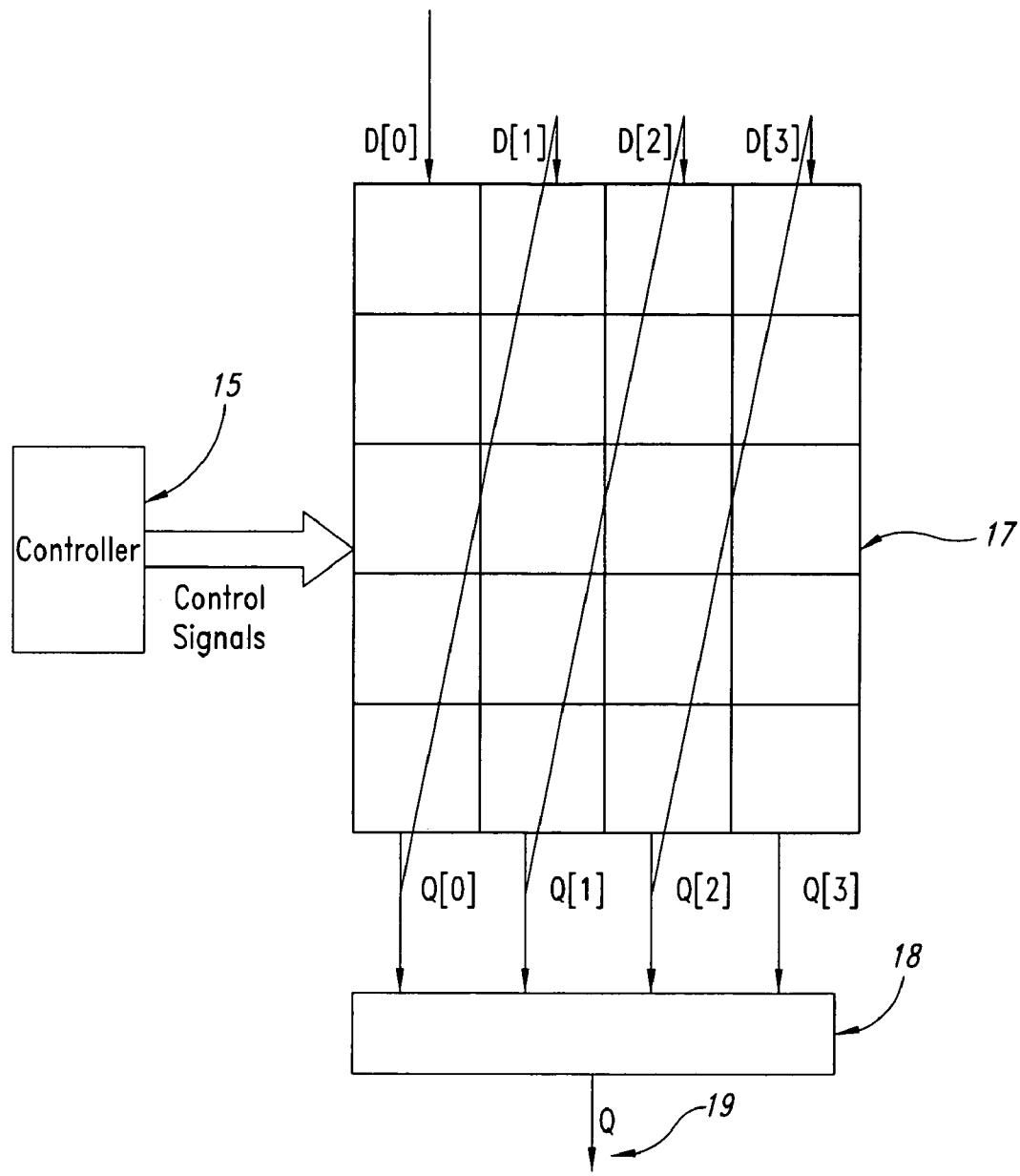
FIG. 3 shows the connection of data pins with output q pins of the memory.

FIG. 3 elaborates the connections between the outputs of the FIFO memory (17) and data bits of the FIFO memory (17) in a particular style.

Each column of memory (17) shown can be of n bits in width, where n is a factor of original width. This can be fixed or programmable. With n=1, 1 bit data is written or read per clock cycle. An example with n=1 is taken to exemplify the operations below.

A multiplexer (18) is connected at the output of memory (17) to select a single bit output (19). The controller (15) as described in FIG. 2 calculates selection bits for the multiplexer (18) and selects the last column containing the valid data storage bits. All the valid data storage bits stored in the memory are taken out serially bit-by-bit. If the amount of valid data storage bits to be read by the receiver is unknown, then total valid bits count should also be available at the output. The counter, which calculates the number of fill operations, stores total valid data storage bits and is used to give this value.

Figure 4:
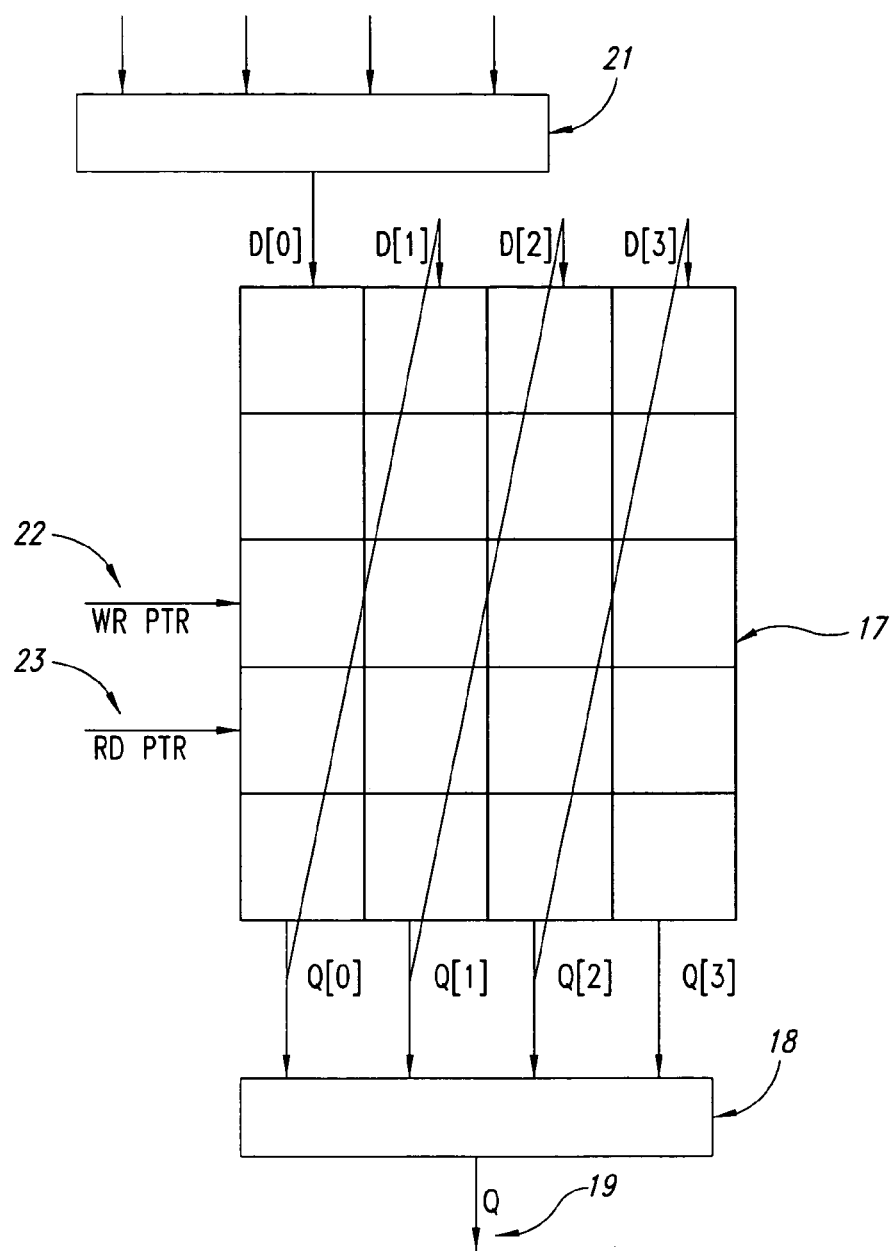
FIG. 4 shows the status of a memory core and read-write pointers after writing 7 bits in the memory.

The reading and writing operations are explained in FIG. 4 with an example to illustrate these operations. If a memory is required to store 5 words and 4 bits, it is converted to a size of 20 words each of 1 bit. Thus 20 cycles are used to store 1 bit each.

Also there can be operations involving variable length data storage bits. There can be any number of write operations each storing any amount of data storage bits. As an example, we take the case of three write operations, storing 2, 4 and 1 bits respectively.

In this case total 7 bits are required to be stored in the memory. While writing, the data two columns would be used D[0] and D[1]. In the first internal write operation data D[0] is written in memory and in the second internal write operation data D[1] is written.

To initiate writing, read and write pointers are reset for the first write operation. The write pointer is placed at the top after reset. As stated, the first two bits are required to be stored; hence in two successive clock cycles after reset, two internal write operations store two valid data storage bits.

Before the read operation is to be performed, N−1 bits are stored in the column of N bits. In the example, a column is of 5 bits, hence still two more bits are required to be stored before reading operation can start. Therefore for the second write operation, which is 4 words, first two internal write operations are done. Now a total 4 bits are stored in memory, which corresponds to the required bit size for internal write and read operations to be done simultaneously. Hence, two simultaneous internal read & write operations are done to complete the second write operation.

For the third write operation, which is of 1 bit, one simultaneous internal read & write operation is done. After three write operations, the FIFO pointers 22 & 23 and memory core has digits stored as shown. Digit 1 shows first bit stored, digit 2 shows second bit stored and so on. X shows invalid data.

Figure 5:
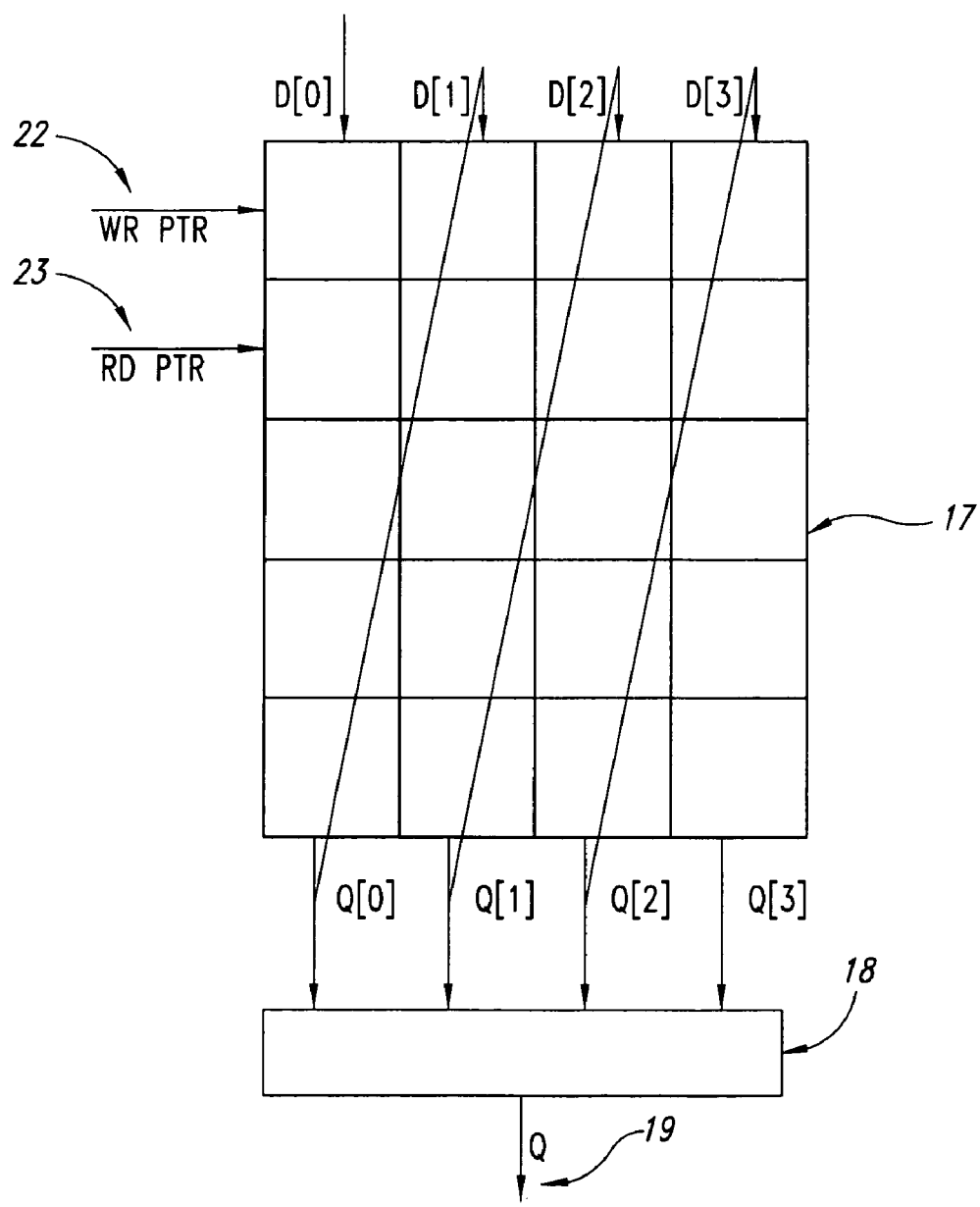
FIG. 5 shows the status of the memory core and read-write pointers after fill operation.

Although the three write operations comprising of 2, 4, 1 bits are complete, the column still requires 3 more bits to fill it. This has been taken care of by a fill operation as shown in FIG. 5. In the fill operation, (words—(NW mod words)) i.e., (5−2) i.e., 3 simultaneous internal read & write operations are done. Also the data is shifted from D[0] to D[1] while the write pointer writes dummy bits in the remaining places. After this operation, the states of the FIFO pointers and the memory core are as shown.

A read operation is used for reading out the entire data written in memory. Read and write pointers are reset. The controller selects Q [1] as the output through select lines of the multiplexer. One internal read operation is done and then simultaneous internal read and write operations, until all the valid data is taken out. The order of data taken out is the same as the order in which it was stored. The data taken out is bit by bit and in the order 1,2,3 . . . 7.

The data is stored and retrieved bit by bit. In the case where "n" number of bits are stored and retrieved in each clock cycle, each column shown can be regarded as n bits wide. In such a case, 100% utilization is achieved only when n is the HCF (highest common factor) or a factor of the HCF, for all possible data lengths. For example, if the data to be stored is of widths 2, 6, 8 and 12 then, n can be 2 or 1 for 100% utilization. In the case of n=2, in each internal read & write operation, 2 bits are written and read. Thus the selection of Q outputs depends upon the number of bits of data to be outputted.

In this methodology when a new write operation is started after a read operation, all the data prior to this write operation is lost. So this methodology doesn't support the case where only a part of the data is read before new data is written and then the part left is read. In this case, new data will be read. Simultaneous read write is also not supported, although these cases rarely, if ever, happen in reality.

The present invention can also be used in data buffers used between source and receiver, which have different data rates. An SRAM with 4 ports instead of 2 ports is taken to avoid clock multiplexing. 2 ports are used for write operations while 2 ports are used for read operations. Write circuitry in the wrapper uses one read and one write port of the memory. Similarly read circuitry in the wrapper uses the other read and write port of the memory. A source clock is used for this circuitry and read-write ports are used for external write operation. A receiver clock is used for this circuitry and read-write ports are used for external read operations. Each read and write circuitry has one reset to reset the address of their ports.

The disclosed embodiments of the present invention therefore facilitate communication smoothly between the source and receiver.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. An on-chip memory device for storing a plurality of instances of variable data bits comprising:
    a memory for storing the variable data bits;
    a memory wrapper for converting the memory into a first in first out memory;
    means for connecting memory output bits to memory data input bits;
    a controller operatively coupled to the memory wrapper for generating control signals for the memory; and
    an output logic for outputting the variable data bits.

2. The on-chip memory device of claim 1 wherein the memory comprises a variable size semi-custom SRAM.

3. The on-chip memory device as claimed in claim 1, wherein the memory comprises a variable size full-custom SRAM.

4. The on-chip memory device as claimed in claim 1 wherein the memory is a dual port memory.

5. The on-chip memory device as claimed in claim 1, wherein the memory is a four port memory.

6. The on-chip memory device as claimed in claim 4 wherein the dual port memory performs normal operations.

7. The on-chip memory device as claimed in claim 5 wherein the four port memory performs data buffering operations.

8. The on-chip memory device as claimed in claim 1 wherein the memory wrapper comprises counters and multiplexers for converting the memory into the first in first out memory.

9. The memory device as claimed in claim 1 wherein the output logic is a multiplexer.

10. The on-chip memory device as claimed in claim 1, wherein the controller comprises a write and read interface for writing and reading the variable data from the memory.

11. A circuit for storing and retrieving data, comprising:
    a memory circuit for storing data bits;
    a wrapper circuit coupled to the memory circuit and configured to convert the memory circuit into a first-in first-out (FIFO) memory;
    a controller for generating control signals to the memory circuit and the wrapper circuit; and
    an output circuit coupled to the controller and the memory circuit for outputting data bits from the memory circuit.

12. The circuit of claim 11 wherein the memory circuit comprises one of a dual port synchronous memory and a four port synchronous memory of any bit size, the memory circuit configured to have a first port used as a write port for writing data in the memory circuit and a second port as a read port for reading data from the memory circuit.

13. The circuit of claim 12 wherein the memory circuit comprises a semi-custom or full custom SRAM memory that is selected to be a dual port memory for use in normal operations and a four port memory for use when the memory circuit functions as a data buffer.

14. The circuit of claim 11 wherein the wrapper circuit comprises counters and multiplexers for converting the memory circuit into a FIFO memory.

15. The circuit of claim 11 wherein the controller comprises a state machine.

16. The circuit of claim 15 wherein the controller is implemented in software.

17. The circuit of claim 11 wherein the output circuit comprises a multiplexer.

18. The circuit of claim 11, further comprising a clock signal generator for generating a clock signal common to the memory circuit and the control circuit.

19. An on-chip memory system for storing and retrieving variable data bits, comprising:
    means for storing variable data bits having at least one write port for writing data into the memory means and at least one read port for reading data from the memory means;
    means for converting the memory means into a first-in first-out (FIFO) memory; and
    means for controlling the memory means and the converting means for performing modified read and write operations internally and an internal fill operation that is performed before reading.

20. The system of claim 19 wherein the converting means is implemented in software.

21. The system of claim 19 wherein the controlling means is implemented in software.

22. The system of claim 19, further comprising means for outputting data from the memory means, the outputting means configured to select bits for output from the memory means in a serial manner.

23. The system of claim 19 wherein the controlling means comprise a state machine.

24. The system of claim 19 wherein the controlling means comprise a read and write interface for storing and reading data from the memory means.

25. The system of claim 19, further comprising means for generating a single clock signal to control read, write, and fill operations in the memory means.

* * * * *